United States Patent [19]
Izu et al.

[11] Patent Number: 5,670,224
[45] Date of Patent: Sep. 23, 1997

[54] MODIFIED SILICON OXIDE BARRIER COATINGS PRODUCED BY MICROWAVE CVD DEPOSITION ON POLYMERIC SUBSTRATES

[75] Inventors: Masatsugu Izu, Bloomfield Hills; Buddie R. Dotter, II, Utica, both of Mich.

[73] Assignee: Energy Conversion Devices, Inc., Troy, Mich.

[21] Appl. No.: 423,666

[22] Filed: Apr. 17, 1995

Related U.S. Application Data

[63] Continuation-in-part of Ser. No. 240,202, May 9, 1994, abandoned, which is a continuation of Ser. No. 976,149, Nov. 13, 1992, abandoned.

[51] Int. Cl.$^6$ ............................................. B32B 1/08
[52] U.S. Cl. .................. 428/35.8; 427/237; 427/238; 427/534; 427/536; 427/563; 427/575; 427/579; 428/34.8; 428/35.2; 428/35.3; 428/35.5; 428/35.7; 428/36.92; 428/336; 428/446; 428/451
[58] Field of Search ........................... 427/237, 238, 427/534, 536, 563, 575, 579; 438/34.8, 35.2, 35.5, 35.7, 336, 446, 451, 35.3, 35.8, 36.92

[56] References Cited

U.S. PATENT DOCUMENTS

| | | | |
|---|---|---|---|
| 3,808,027 | 4/1974 | Anderson et al. | 428/332 |
| 4,478,874 | 10/1984 | Hahn | 427/525 |
| 4,528,234 | 7/1985 | Kaiho et al. | 428/216 |
| 4,552,791 | 11/1985 | Hahn | 428/35.7 |
| 4,667,620 | 5/1987 | White | 118/50.1 |
| 4,673,586 | 6/1987 | White | 427/562 |
| 4,675,205 | 6/1987 | Boncoeur et al. | 427/536 |
| 4,684,553 | 8/1987 | Sasaki et al. | 206/524.6 |
| 4,702,963 | 10/1987 | Phillips et al. | 428/426 |
| 4,735,832 | 4/1988 | Ichikawa et al. | 428/36.6 |
| 4,737,379 | 4/1988 | Hudgens et al. | 427/575 |
| 4,756,964 | 7/1988 | Kincaid et al. | 428/40.8 |
| 4,981,724 | 1/1991 | Hochberg et al. | 427/255.3 |
| 4,992,299 | 2/1991 | Hochberg et al. | 427/38 |
| 4,992,306 | 2/1991 | Hochberg et al. | 427/255.3 |

(List continued on next page.)

OTHER PUBLICATIONS

H.L. Allison, "Super–Barrier Glass Coated Films Near Commercialization", *Conference Proceedings, Pack Alimentaire '92 Food & Beverage Packaging Conference*, Jun. 9–10, 1992, published by Innovative Expositions, Inc., Three Independence Way, Princeton, NJ 08540–6621.

A. Rizika, "QLF™ Coatings—The Commercialization Process", *Conference Proceedings, Pack Alimentaire '92 Food & Beverage Packaging Conference*, Jun. 9–10, 1992, published by Innovative Expositions, Inc., Three Independence Way, Princeton, NJ 08540–6621.

"Progress with QLF Barrier Coating For Plastic Packaging", *The BOC Technology Magazine*, No. 16, Apr. 1992, pp. 12–17.

*Primary Examiner*—D. S. Nakarani
*Attorney, Agent, or Firm*—David W. Schumaker; Marvin S. Siskind; Marc J. Luddy

[57] ABSTRACT

A method of depositing, by microwave plasma enhanced chemical vapor deposition, a modified, silicon oxide, barrier coating atop a temperature sensitive substrate; said barrier coating having barrier properties to at least gaseous oxygen and water vapor. The precursor gaseous mixture includes at least a silicon-hydrogen containing gas, an oxygen containing gas and a gas containing at least one element selected from the group consisting of germanium, tin, phosphorus, and boron. The method requires introducing a sufficient flow rate of oxygen-containing gas into the precursor gaseous mixture to eliminate the inclusion of silicon-hydrogen bonds into the deposited coating. The preferred modifier is germanium. Also, a composite material having a microwave-plasma-enhanced-chemical-vapor-deposited silicon oxide (modified or non-modified) barrier coating. The barrier coating has barrier properties to at least gaseous oxygen and water vapor and is substantially free of Si—H bonds. The barrier coating is deposited by the instant method on a temperature sensitive substrate.

25 Claims, 5 Drawing Sheets

U.S. PATENT DOCUMENTS

| | | | |
|---|---|---|---|
| 5,026,135 | 6/1991 | Booth | 350/96.12 |
| 5,028,566 | 7/1991 | Lagendijk | 437/238 |
| 5,041,303 | 8/1991 | Wertheimer et al. | 427/39 |
| 5,070,811 | 12/1991 | Feuerstein et al. | 118/623 |
| 5,084,356 | 1/1992 | Deak et al. | 428/458 |
| 5,085,904 | 2/1992 | Deak et al. | 428/35.7 |
| 5,091,062 | 2/1992 | Revell | 205/138 |
| 5,100,720 | 3/1992 | Sawada et al. | 428/215 |
| 5,107,791 | 4/1992 | Hirokawa et al. | 118/719 |
| 5,112,673 | 5/1992 | Sawada et al. | 428/216 |
| 5,122,410 | 6/1992 | Löfgren et al. | 428/216 |
| 5,168,541 | 12/1992 | Booth | 385/129 |
| 5,204,141 | 4/1993 | Roberts et al. | 427/255.3 |
| 5,223,308 | 6/1993 | Doehler | 427/575 |
| 5,224,441 | 7/1993 | Felts et al. | 118/718 |
| 5,230,923 | 7/1993 | Hirokawa et al. | 427/248.1 |
| 5,232,755 | 8/1993 | Komiya et al. | 428/36.91 |
| 5,271,977 | 12/1993 | Yoshikawa et al. | 428/35.9 |
| 5,279,853 | 1/1994 | Occhiello et al. | 427/162 |
| 5,279,873 | 1/1994 | Oike | 428/35.4 |
| 5,296,070 | 3/1994 | Take et al. | 156/244.11 |
| 5,302,208 | 4/1994 | Grimm et al. | 118/718 |
| 5,308,649 | 5/1994 | Babacz | 427/562 |

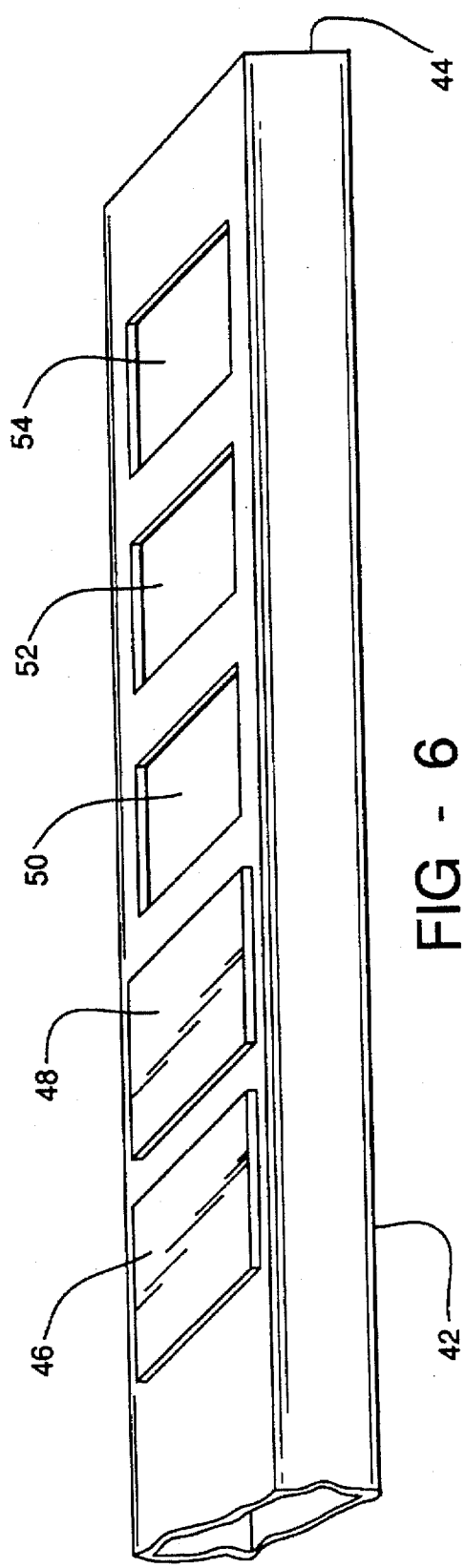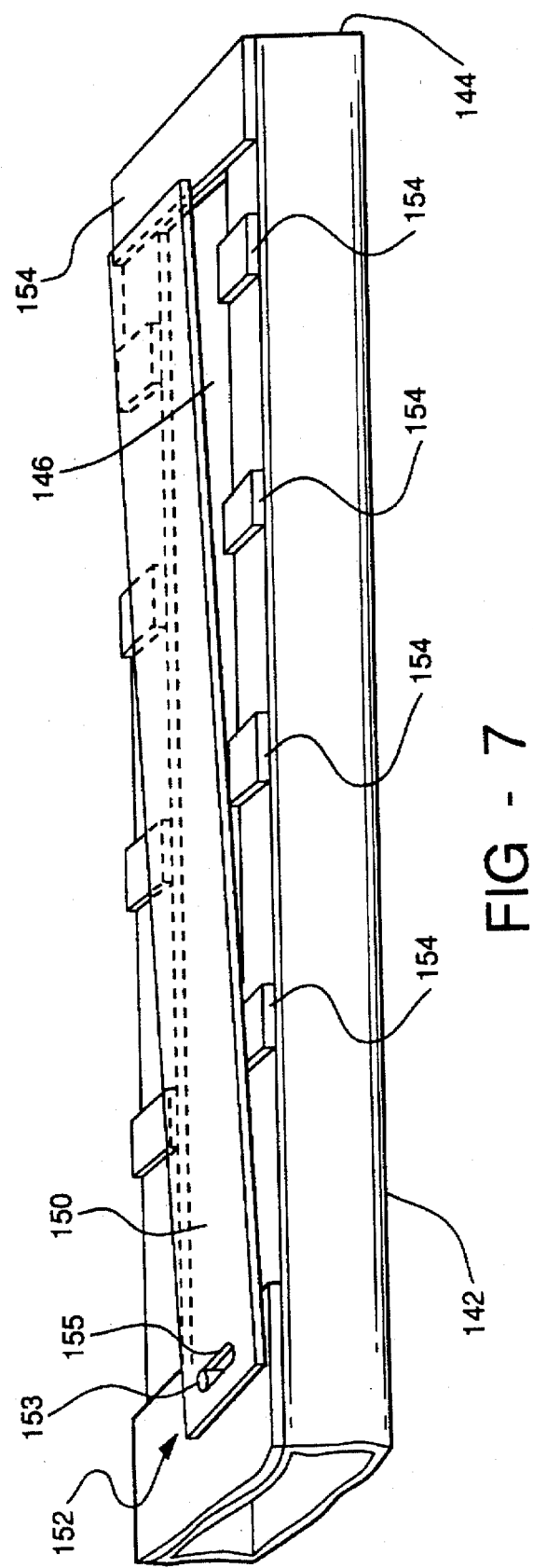

MODIFIED SILICON OXIDE BARRIER COATINGS PRODUCED BY MICROWAVE CVD DEPOSITION ON POLYMERIC SUBSTRATES

RELATED APPLICATION INFORMATION

This application is a continuation-in-part of U.S. application Ser. No. 08/240,202 filed May 9, 1994, now abandoned, which is a file-wrapper-continuation of U.S. application Ser. No. 07/976,149 filed Nov. 13, 1992, now abandoned.

FIELD OF THE INVENTION

The instant invention relates to an oxygen and water vapor barrier product and a method of fabricating the product. More particularly the invention relates to the microwave CVD deposition of chemically modified, silicon oxide, thin-film barrier films onto temperature sensitive substrates, such as webs of polymer-film materials.

BACKGROUND OF THE INVENTION

Containers for chemically sensitive materials such as food products traditionally have been made from inorganic materials such as glass. Glass containers are transparent and permit the consumer to view the product before purchasing it. Moreover, glass containers are essentially impermeable to atmospheric gases such as oxygen and hence protect the product. However, glass containers are expensive, heavy and susceptible to breakage. Accordingly, considerable effort has been devoted to development of containers made from polymeric materials such as thermoplastics. Thermoplastic containers can be made inexpensively. They are light in weight and hence inexpensive to ship. They are resistant to breakage and can be fabricated in convenient shapes.

However, polymeric containers ordinarily are permeable to atmospheric gases and to gases in the packaged product. This drawback has limited the use of polymeric containers in many applications. Various approaches have been taken towards eliminating the permeability of polymeric containers. Certain polymers have relatively low permeability to particular gases. Containers fabricated from these polymers sometimes can provide satisfactory resistance to permeation for particular applications. However, use of these particular, low permeability polymers can introduce additional problems of cost, transparency, or strength. In certain cases, the low permeability polymers are incompatible with the product to be contained. To alleviate these drawbacks composite containers incorporating one or more layers of a low permeability polymer in conjunction with layers of other polymers have been used. This approach is costly and can make it more difficult to recycle the containers using common recycling techniques such as melt processing.

Another method to decrease the permeability of polymer packaging to aromas, flavors, water and oxygen is the use of synthetic films on which aluminum has been vapor-deposited. However, these have the disadvantage that they are not transparent to light and microwaves. See-through, transparent packages provide marketing advantages over non-transparent packages in many product applications. In addition, because of the proliferation of microwave ovens into nearly all areas of the industrialized world, the microwave transparency of packaging materials is, in many cases, of decisive importance. Furthermore, aluminized items are difficult to recycle or dispose of.

In order to combine the advantages of the synthetic films transparent to light and microwaves with the advantages of aluminized films which form very good barriers to aromas, flavors, water and oxygen, the prior art has coated polymer films with metal oxides. Silicon oxide has been found to be a particularly suitable coating material.

Early methods of coating synthetic films with metal oxides such as $SiO_x$ used processing techniques in which the metal oxides were vaporized out of the solid phase. That is, the deposition of $SiO_x$ coatings was accomplished by vaporizing SiO by means thermal means or by means of electron beam vaporization. Since SiO sublimates—i.e. vaporizes directly from the solid state and not by way of a liquid phase—a special crucible was necessary. To achieve film band speeds of a few m/s which represents a prerequisite for an economical production at acceptable cost, crucibles for vaporization temperatures of approximately 1,350 degree(s) C. were required. The $SiO_x$ vapor oxidizes in a controlled reactive atmosphere and reaches a degree of oxidation of x=1.5 to 1.8 on a film to be coated. One main drawback to the evaporation deposition method are that the coatings have a yellow or grey tint and are therefore not truly colorless and transparent. Also, the barrier layer must be thick (several hundred to several thousand Angstroms) to provide acceptable barrier characteristics. Additionally, the coatings are mechanically inflexible and fragile, resulting in pinholes and other damage during down-stream processing. Furthermore, the deposition rate is relatively slow, resulting in high cost.

More recently, RF-PECVD (radio frequency plasma enhanced chemical vapor deposition) has been employed to coat large substrates, e.g., plastic containers and long rolls of flexible films for food packaging applications. In the process, plasma chemical vapor deposition is used to deposit silicon oxide based thin films from silicon containing gases such as silane or volatile organosilicon compounds. This method of depositing an adherent, hard silicon oxide based film comprises providing a gas stream with several components, establishing an RF glow discharge plasma form one or more components of the gas stream within a previously evacuated deposition chamber, in which a substrate is movably positioned adjacent the plasma, and controllably flowing the gas stream into the plasma to deposit a silicon oxide onto the substrate when positioned adjacent the plasma. The gas stream components typically include a volatilized silicon containing compound or a silicon containing gas, oxygen, and an inert gas such as helium or argon.

While this method has improved the quality of the deposited films, their thickness still must be as high as several hundred to thousand Angstroms to achieve very high barrier properties.

There is at least one important limitation with the use of RF (or other low frequency) PECVD plasma deposition procedures to deposit barrier layers. The problem is that deposition rates by radio frequency (or other low frequency) plasma are inherently much slower than the same processes carried out at microwave frequency, because energy coupling between radiation and gaseous molecules is inefficient at such low frequencies. Typically, low frequency plasma CVD processes are performed in a reactor at a pressure of from one hundred to a few thousand milliTorr. Any attempt to increase the deposition rate by increasing the input power generally results in the formation of powdery particulate within the plasma and deterioration of the coating quality. Therefore, for practical purposes, such as in a production line, radio frequency plasmas tend to be too slow or require enormous deposition apparatus, and as such are not cost effective.

The most recent development in the field of barrier layer deposition has been the use of microwave PECVD (MW- PECVD) to deposit barrier layers onto polymeric substrates. This method is described in U.S. Pat. No. 5,041,303, ('303) issued Aug. 20, 1991 to Wertheimer et al. In the method of the '303 patent, Wertheimer, et al. use evanescent microwaves from a slow wave microwave applicator to excite a plasma and deposit barrier layers. While the '303 patent suggests plasma deposition of SiO (using $SiH_4$ and $NO_2$) it is but one of a myriad of possible choices for which no specific enabling disclosure is presented (i.e. microwave power, gas flow rates, barrier layer thickness, barrier properties, etc.) While the '303 patent does not teach the specifics of it's suggested SiO barrier layer, it does teach specifics for a SiN barrier layer. If the SiN layer's properties are any indication of the properties of an SiO layer produced by this same process, it is quite evident that the Wertheimer et al. process is no better than that of the prior art methods. That is, SiN barrier layers of between 1 and 10000 Angstroms give only moderately good barrier properties. Additionally, the slow wave evanescent applicator used by Wertheimer et al. (invented by Wertheimer in the 1970's) is a notoriously inefficient means to couple microwaves into a plasma.

In our copending U.S. application Ser. No. 08/240,202 filed May 9, 1994, the contents of which are hereby incorporated by reference, we disclosed a microwave PECVD process for depositing silicon oxide barrier coatings. It should be noted that microwave plasma CVD processes are typically operated at a reactor pressure as low a few milli-Torr and therefore, depositions rates as high as 500 Angstroms per second can be achieved without forming powders. The microwave deposition processes discovered by the instant inventors can deposit barrier coatings having exceptionally good barrier properties at approximately 100 to 130 Angstroms thick. This is the thinnest barrier coating having high barrier properties reported by the industry to date.

The importance of controlling the hydrogen content of prior art films for the purpose of, inter alia, depositing oxygen impermeable films has been discussed in commonly assigned U.S. Pat. No. 4,737,379, the disclosure of which is incorporated herein by reference. As was noted therein, plasma deposited amorphous silicon hydrogen alloys, as well as alloys of silicon and hydrogen with one or more of carbon, oxygen and nitrogen suffered from various shortcomings. The hydrogen content was strongly dependent upon the substrate temperature, that content decreasing at high temperatures and increasing at low temperatures.

The deleterious effect of hydrogenation on film properties, such as oxygen and water vapor permeability, were found to be a direct consequence of hydrogen's role as a chemical bond terminator. As such, hydrogen can disrupt the connectivity of the chemical bond network of the deposited film, thereby reducing its average atomic coordination number.

The solution preferred by the '379 patent was to eliminate the presence of hydrogen for the feedstock gases. This was at least partially due to the fact that thermally sensitive substrates, such as plastics, could not be heated sufficiently to eliminate hydrogen bonding in the deposited thin films. This inability to drive off hydrogen produced thin films characterized by greatly deteriorated properties which limited the utility of said films. However, the recipes set forth in the '379 patent fail to provide a coating which exhibits the type of oxygen and water vapor permeation characteristics demanded by the food packaging industry.

It should be noted that there are many processing steps in the manufacturing of polymer based packaging products. Down-stream processes include coating, lamination, printing, heat-treatment, etc. These processes may create pinholes and other defects in the barrier coatings. Retention of these barrier properties during manufacturing processes and in use is an important performance criterion for any barrier coating.

Therefore, there is a need in the art for a method of depositing improved thin-film oxygen and water vapor impermeable flexible coatings atop temperature sensitive webs of substrate material and for products made by these methods. As will be described below, the instant inventors have found that the addition of modifier elements to the basic silicon oxide coating improved the robustness of the barrier coating, thereby improving the barrier performance of the final product after down-stream processing.

BRIEF SUMMARY OF THE INVENTION

Microwave plasma CVD processes are typically operated at a reactor pressure as low a few milliTorr and therefore, depositions rates as high as 500 Angstroms per second can be achieved without forming powders. The microwave deposition processes of the instant invention can deposit barrier coatings having exceptionally good barrier properties at approximately 100 to 130 Angstroms thick. This is the thinnest barrier coating having high barrier properties reported by the industry to date.

The present invention includes a method of depositing, by microwave plasma enhanced chemical vapor deposition, a modified, silicon oxide, barrier coating atop a temperature sensitive substrate; said barrier coating having barrier properties to at least gaseous oxygen and water vapor. The method includes the steps of 1) providing an evacuable deposition chamber having a deposition region defined therein; 2) providing a source of microwave energy; 3) providing a temperature sensitive substrate within the deposition region in the deposition chamber; 4) evacuating the deposition chamber to a sub-atmospheric pressure; 5) performing a plasma pretreatment of the temperature sensitive substrate; 6) introducing a precursor gaseous mixture, which includes at least a silicon-hydrogen containing gas, an oxygen containing gas and a gas containing at least one element selected from the group consisting of germanium, tin, phosphorus, and boron, into the deposition region within the deposition chamber; 7) directing microwave energy from the source of microwave energy to the deposition region, thereby creating a plasma in the deposition region by interaction of the microwave energy and the precursor gaseous mixture; 8) depositing from the plasma onto the temperature sensitive substrate a coating of material which provides the coated substrate with oxygen and water vapor barrier properties greater than the non-coated substrate; and 9) introducing a sufficient flow rate of oxygen-containing gas into the precursor gaseous mixture to eliminate the inclusion of silicon-hydrogen bonds into the deposited coating.

The preferred gas containing at least one modifier element selected from the group consisting of germanium, tin, phosphorus, and boron is a gas which contains germanium.

The instant invention also includes a composite material having a microwave-plasma-enhanced-chemical-vapor-deposited silicon oxide barrier coating. The barrier coating having barrier properties to at least gaseous oxygen and water vapor and is substantially free of Si—H bonds. The barrier coating is deposited on a temperature sensitive substrate. The composite is produced by a method which includes the steps of: 1) providing an evacuable deposition chamber having a deposition region defined therein; 2) providing a source of microwave energy; 3) providing the temperature sensitive substrate within the deposition region in the deposition chamber; 4) evacuating the deposition chamber to a sub-atmospheric pressure; 5) performing a plasma pretreatment of the temperature sensitive substrate; 6) introducing a precursor gaseous mixture into the deposition region within the deposition chamber, the precursor gaseous mixture including at least a silicon-hydrogen containing gas and an oxygen containing gas; 7) directing microwave energy from the source of microwave energy thereby creating a plasma in the deposition region by interaction of the microwave energy and the precursor gaseous mixture; 8) depositing from the plasma, onto the temperature sensitive substrate, a silicon oxide barrier coating, the coating providing the coated substrate with oxygen and water vapor barrier properties greater than the non-coated substrate; and 9) introducing a sufficient flow rate of oxygen-containing gas into the precursor gaseous mixture to eliminate the inclusion of silicon-hydrogen bonds into the deposited coating.

The precursor gaseous mixture may further includes a gas containing at least one modifier element selected from the group consisting of germanium, tin, phosphorus, and boron. Preferably the modifier is germanium.

BRIEF DESCRIPTION OF THE DRAWINGS

FIG. 6 is a fragmentary perspective view illustrating a first embodiment of a radiative microwave applicator useful for performing the process of the instant invention with spacedly disposed discrete apertures formed through one of the wider faces thereof;

FIG. 7 is a fragmentary perspective view illustrating a second embodiment of a radiative microwave applicator useful for performing the process of the instant invention with a single elongated aperture formed through one of the wider faces thereof and shutter means disposed thereover.

DETAILED DESCRIPTION OF THE INVENTION

Figure 1:
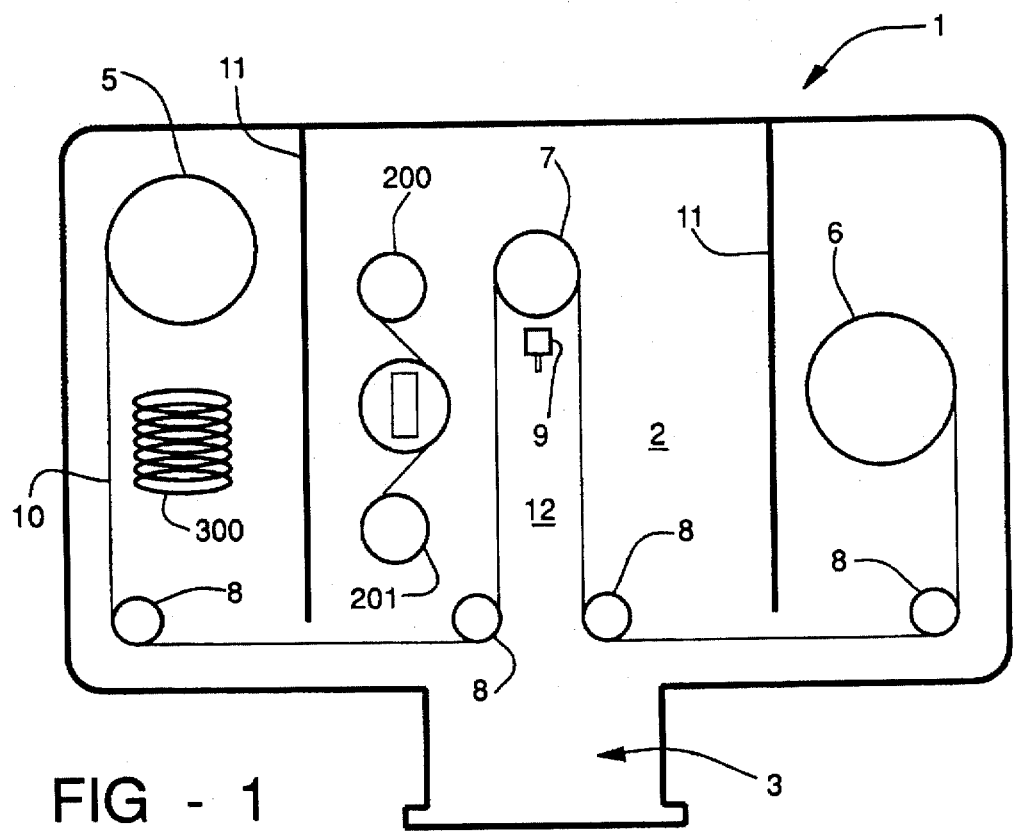
FIG. 1 is a schematic cross-sectional view of a first embodiment of a deposition apparatus useful for performing the process of the instant invention, specifically illustrating the elements operatively disposed therein for effecting the uniform microwave plasma deposition on an elongated substrate; this figure illustrates an embodiment having a single plasma deposition region, employing a single gas manifold and a single elongated microwave applicator.

FIG. 1, illustrates, in schematic cross-section, a first embodiment of a microwave deposition apparatus 1 for sustaining a substantially uniform microwave plasma over a relatively wide web of substrate material. As used herein, the term "wide" refers to a body having a width dimension greater than one microwave wavelength, and preferably greater than twelve inches. The apparatus 1 includes, inter alia, a vacuum vessel deposition chamber 2, the walls of which are preferably formed of a durable, corrosion resistant material such as stainless steel. The vacuum vessel deposition chamber 2 further includes a pump-down port 3 adapted for suitable connection to a vacuum pump for maintaining the interior of the vacuum vessel deposition chamber 2 at an appropriate sub-atmospheric pressure. The vacuum pump is further adapted to remove reaction products from the interior of said vessel 2.

The vessel 2 further includes at least one process gas input line connected to a process gas input manifold 9, which manifold 9 is operatively disposed so as to uniformly distribute processed gases into the interior of said reaction vessel 2, and specifically into the plasma deposition region 12 thereof. The process gas input manifold 9 is operatively disposed between a pair of process gas containment means 11 and between at least two sections of the web of substrate material which define the deposition region 12. In combination, the web of substrate material and the process gas containment means 11 contain the process gas introduced by the manifold 9 into the plasma region 12 of the vacuum vessel deposition chamber 2.

During operation, the web of substrate material is drawn from payoff roll 5 and guided by guide rollers 8 toward the deposition region. Guide rollers 8 may be variable tension rollers to relieve stress upon the web of substrate material as it passes through the deposition chamber. After passing along one or more guide roller 8, the web of substrate material is passed between the linear microwave applicator 4 and the process gas injection manifold 9, The web of substrate material is then passed around chill roller 7, again passing gas port 9, around additional guide rollers 8, and collected upon take-up roll 6. The sections of the web of substrate material extending between guide roller 8 and chill roller 7 create an enclosed plasma deposition region 12. The precursor gas mixture injected from gas manifold 9 interacts with the microwave energy supplied by the elongated microwave applicator 4 to create energized species in deposition region 12. Deposition therefore occurs on both the section of substrate material leading toward and moving away from chill roller 7. Because plasma deposition is inherently a high temperature process, temperature sensitive substrates must be intermittently cooled so that destruction thereof is avoided. This cooling is accomplished by chill roller 7. Cooling the web of substrate material allows for a longer overall exposure time to the plasma deposition. The apparatus of FIG. 1 allows for high deposition rates and good process gas utilization by allowing for deposition on at least two discrete portions of the web of substrate material on a single pass.

The microwave deposition apparatus 1 further includes a microwave applicator unit 4 which extends at least partially into the interior of said vacuum vessel deposition chamber 2. The microwave applicator unit 4 is adapted to radiate microwave energy from a source thereof, into the interior of said vacuum vessel deposition chamber 2 for initiating and maintaining a plasma of the process gases introduced into said vessel 2 through a process gas manifold 9. The specifics of the microwave applicator unit 4 including the microwave applicator and microwave applicator isolating means will be discussed in detail hereinbelow.

Figure 2:
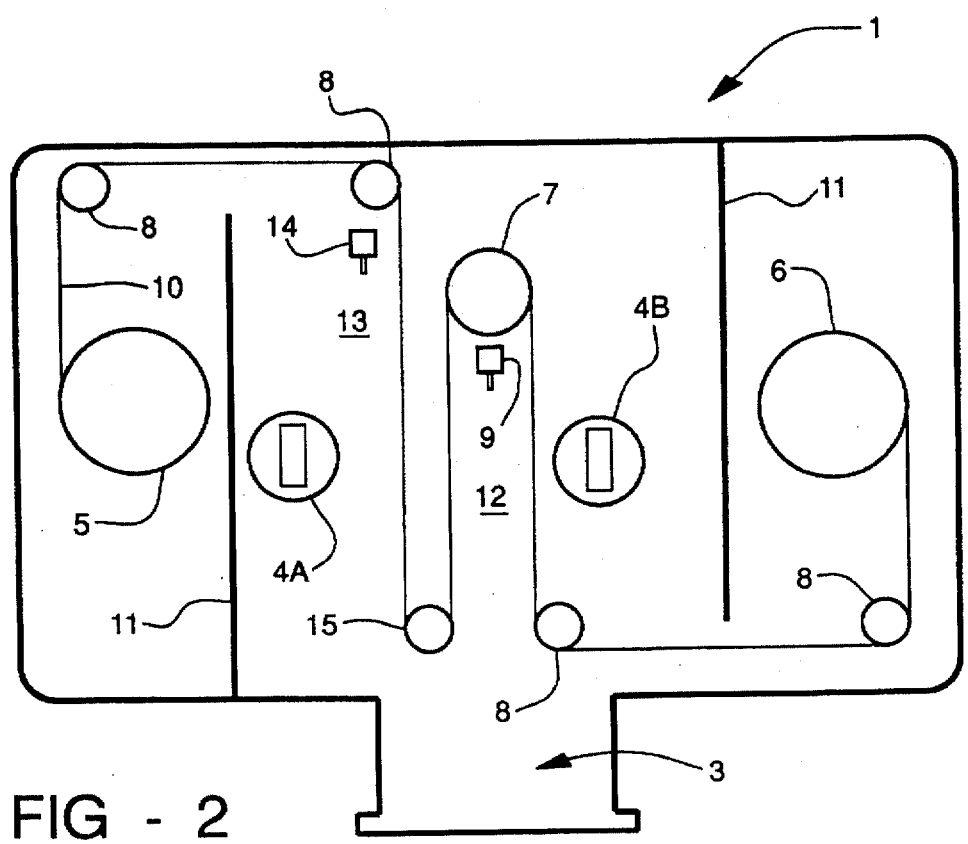
FIG. 2 is a schematic cross-sectional view of a second embodiment of a deposition apparatus useful for performing the process of the instant invention, this embodiment employs a single deposition region, a single elongated microwave applicator, and two gas manifolds, the first of which is adapted to introduce the pre-cursor gaseous mixture and the second of which is adapted to introduce a non-depositing gas mixture to effectuate plasma pre-treatment of the deposition surface of the elongated web of substrate material.

Turning now to FIG. 2, there is shown a schematic cross-sectional view of a second embodiment of a microwave deposition apparatus useful for performing the process of the instant invention. This second embodiment is similar to the microwave deposition apparatus of the first embodiment (FIG. 1) with the exception of the addition of a deposition surface pretreatment zone. The instant inventors have surprisingly found that microwave pretreatment of the deposition surface of the web of substrate material enhances the barrier properties of the deposited thin film. This microwave pre-treatment is preferably a plasma pre-treatment and most preferably an argon plasma pre-treatment. The argon plasma pre-treatment of the deposition surface of the web of substrate material occurs in a plasma pre-treatment zone 13. The argon is injected into the plasma pre-treatment zone 13 by pre-treatment gas manifold 14. The injected argon interacts with the microwaves from the linear microwave applicator 4 thereby pretreating the deposition surface of the web of substrate material. In order to pass the deposition surface of the web of substrate material past pre-treatment zone 13, the guide rollers 8 on the payoff roll 5 side of the deposition apparatus 1 must be moved to the opposite side of the microwave applicator visa vis the deposition apparatus of FIG. 1. In addition, another roller 15 must be added to the system. This additional roller 15 can be either a guide roller or a quench roller as required. It is hypothesized that this pretreatment process promotes the adherence of the coating to the web and possibly even affects the growth kinetics thereof.

Figure 3:
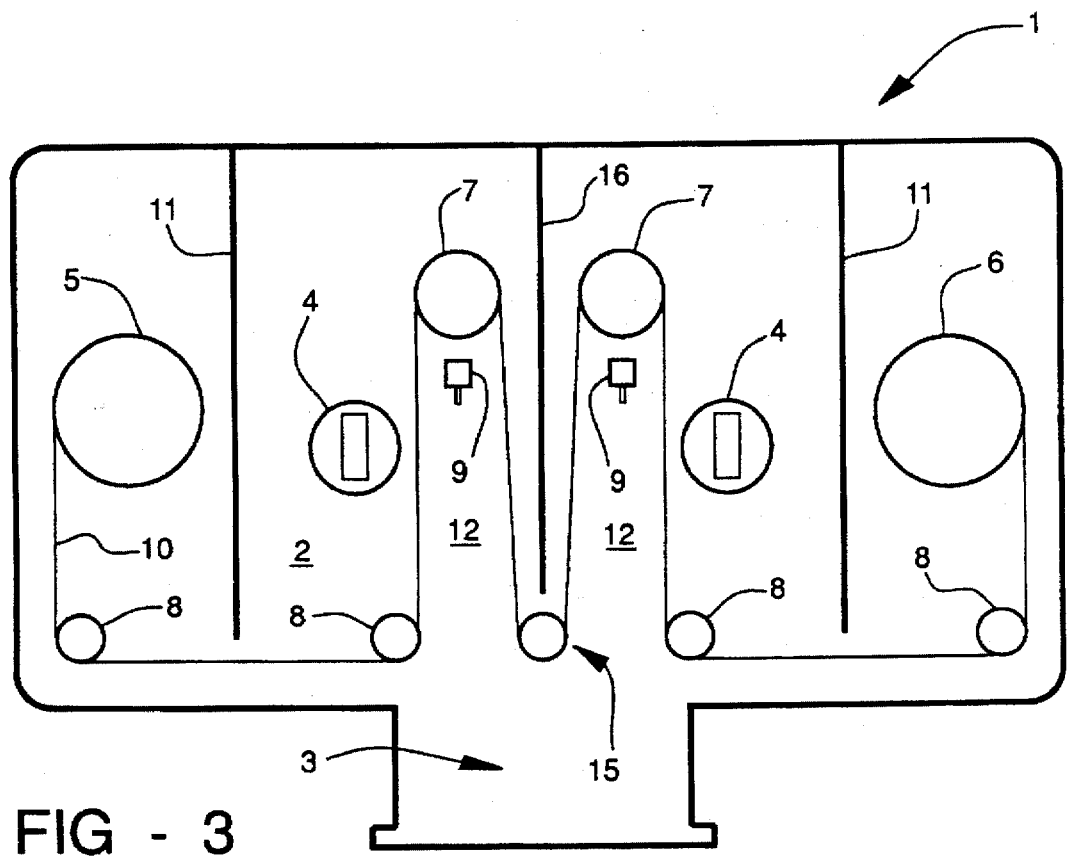
FIG. 3 is a schematic cross-sectional view of a third embodiment of a deposition apparatus useful for performing the process of the instant invention, this apparatus employing two deposition regions, two elongated microwave applicators and two precursor gas mixture injection manifolds.

Turning now to FIG. 3, illustrated therein is a schematic cross-section of a third embodiment of a microwave deposition apparatus. This third embodiment is similar to the first embodiment of FIG. 1 except for the inclusion of an additional deposition region 12 which includes an additional chill roller 7, an additional gas manifold 9, an additional guide roller 8, and an additional linear microwave applicator 4. Also, the embodiment of FIG. 3 includes a microwave barrier 16 which reduces or eliminates the interaction of microwaves from the linear applicators 4. This embodiment provides for very high deposition rates, due to the dual deposition regions 12 which allow deposition on at least four discreet portions of the web of substrate material during a single pass. This higher deposition rate allows for faster throughput of the web of substrate material, for a given deposited thin film thickness. This higher throughput speed reduces the temperature rise of the web of substrate material at any given deposition zone by reducing the time of exposure to the deposition plasma and allowing the web of substrate material to pass over cooling rollers between depositions.

Alternatively, the first deposition region of the microwave deposition apparatus of FIG. 3 may be used as a plasma pre-treatment region. In this instance, the deposition zone 12 which is closest to the pay off reel 5 would be used as a plasma pre-treatment zone 13, as in FIG. 2, by providing a non-depositing gas or gaseous mixture, such as argon, in the first gas manifold 9. This alternative embodiment would reduce any microwave losses encountered by the deposition apparatus of FIG. 2 due to the plasma pre-treatment microwave energy load by providing a separate linear microwave applicator for each of the plasma pre-treatment and plasma deposition zones.

Figure 4:
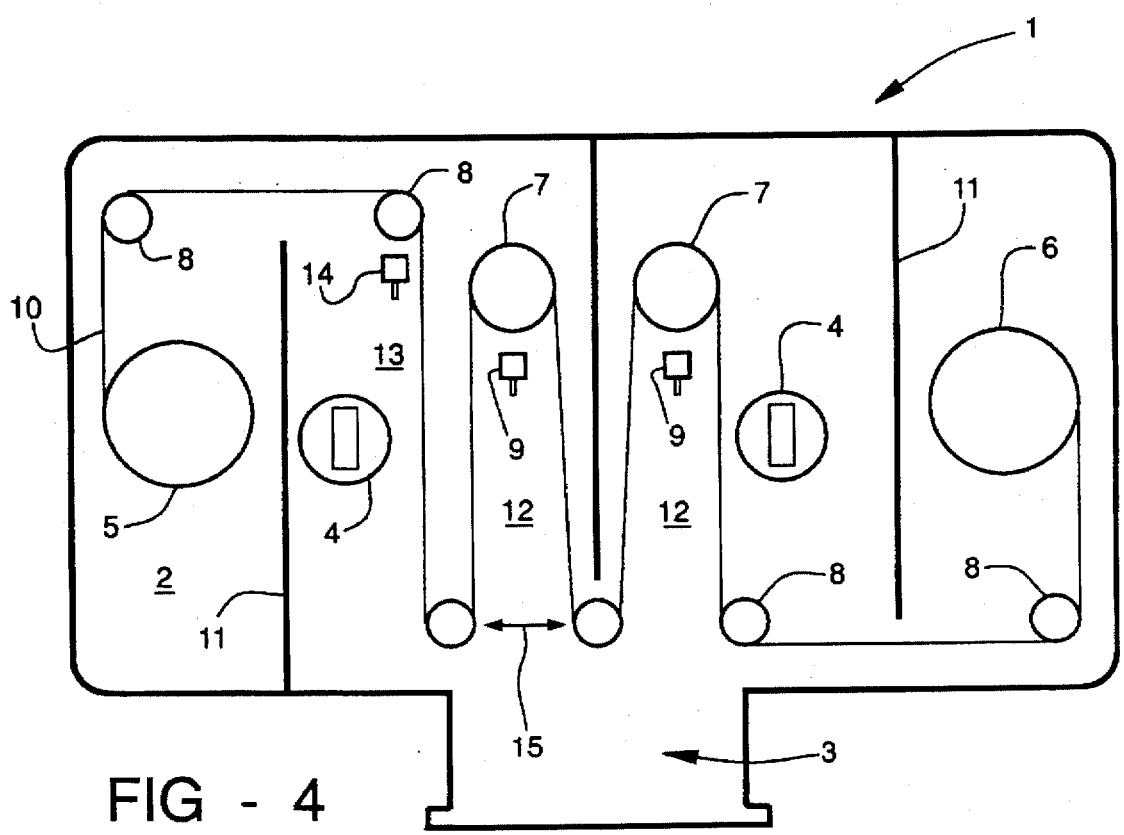
FIG. 4 is a schematic cross-sectional view of a fourth embodiment of a deposition apparatus useful for performing the process of the present invention, this embodiment employs two elongated microwave applicators and three gas manifolds, two of which are adapted to introduce precursor gaseous mixture into the deposition regions and a third adapted to introduce a non-depositing gas mixture for the plasma pre-treatment of the deposition surface of the elongated web of substrate material.

Turning now to FIG. 4, there is depicted therein a cross-sectional schematic representation of a fourth embodiment of a microwave deposition. This embodiment combines both the dual deposition regions 12 of the embodiment of FIG. 3 and the plasma pretreatment region 13 of the embodiment of FIG. 2. Therefore, this embodiment allows for both high deposition rate/high throughput and plasma pre-treatment of the deposition surface of the web of substrate material for enhancement thereof.

Figure 5:
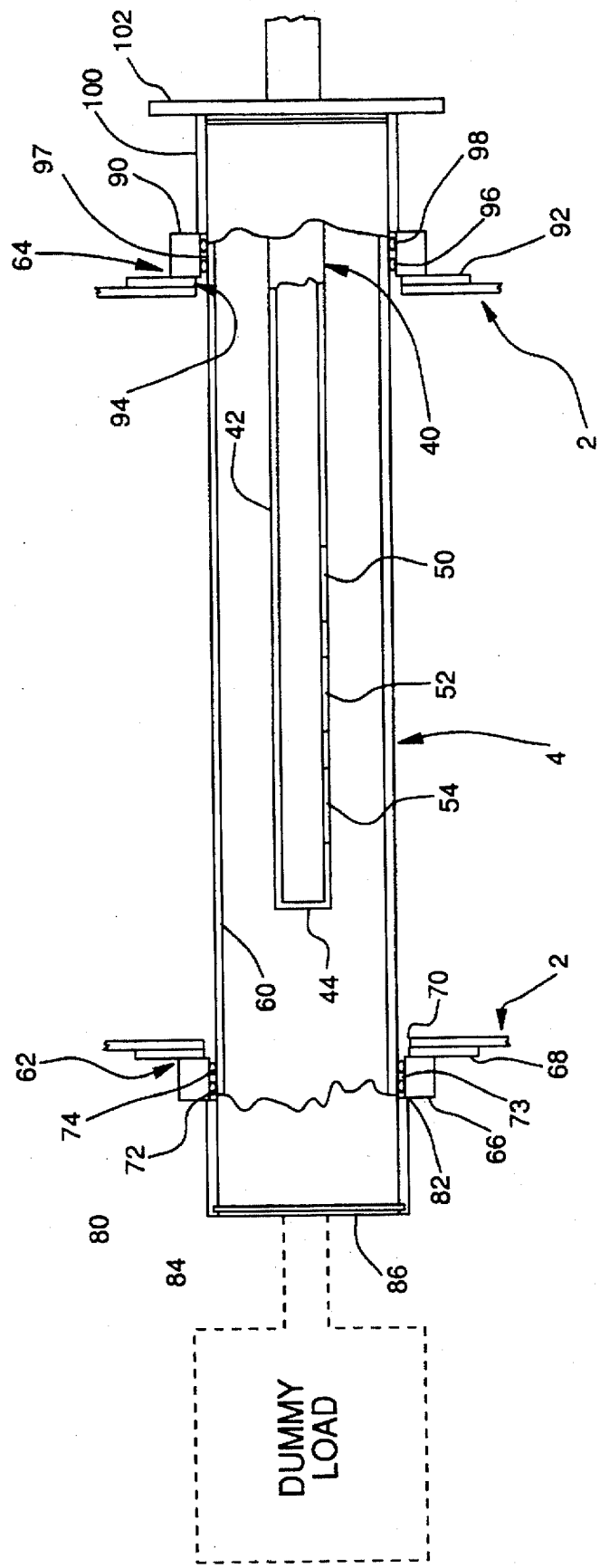
FIG. 5 is a cross-sectional view of a portion of an apparatus useful for performing the process of the instant invention, specifically depicting a radiative linear microwave applicator unit operatively attached interiorly of the deposition chamber.

As is illustrated in FIG. 5, the microwave applicator unit 4 comprises a substantially rectangular waveguide 42 having an open end portion 44 at the terminal end portion thereof extended into the vessel 2. The open end portion is adapted to avoid standing waves. It is to be understood that the applicator unit 4 may alternatively be sealed at the terminal end thereof. The waveguide means 42 includes a plurality of apertures formed through a wider face thereof. The apertures are sized and spaced to provide for the uniform radiation of microwave energy therefrom.

Figure 8:
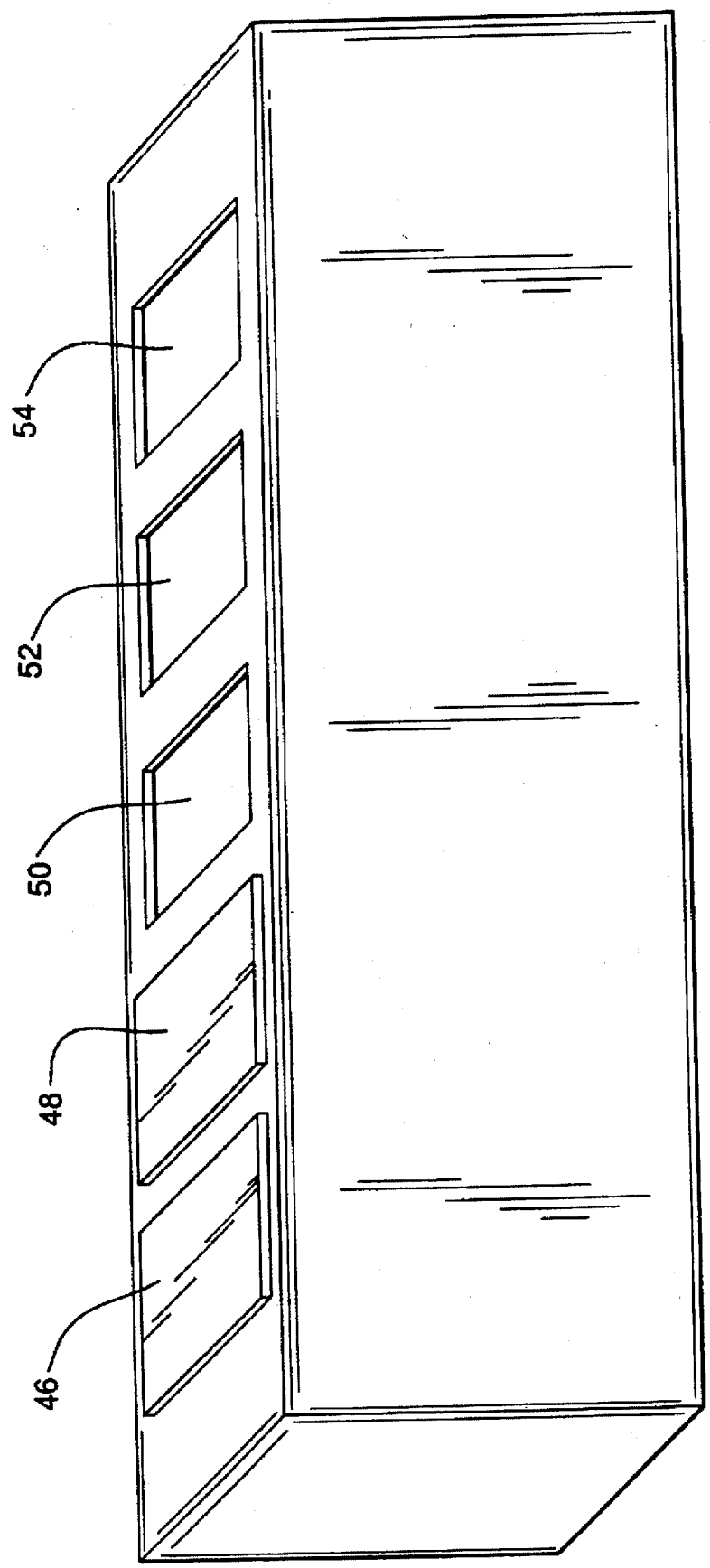
FIG. 8 is a fragmentary perspective view illustrating a third embodiment of a linear radiative microwave applicator useful for performing the process of the instant invention in which the spacedly disposed apertures are formed along the longitudinal extent of one of the narrower faces thereof.

Illustrated in greater detail in FIG. 6, is a fragmentary perspective view of the microwave applicator unit rectangular waveguide 42 having the terminal end portion 44, and a plurality off spacedly disposed apertures, 46, 48, 50, 52 and 54 formed through a wider face thereof. As is illustrated therein, apertures 46 and 48 are blocked by microwave absorbing material to prevent microwave energy from radiating therefrom. It is to be understood that the density of the microwave energy radiated by the microwave applicator waveguide 42 can be distributed in a desired, controllable manner simply by blocking and partially unblocking various ones of the apertures. In FIG. 8, a second microwave applicator embodiment is depicted only differing from the FIG. 6 embodiment by the formation of said apertures through one of the narrower rectangular faces of the waveguide. Experiments have demonstrated that it is possible to maintain plasma uniformity over large area substrates, while increasing the amount of microwave energy introduced into the chamber by forming the apertures in the narrow waveguide face. This is believed to be due to the fact that current nodes are convergent along the narrower face as the microwaves travel through the rectangular waveguide structure.

The instant inventors have found that the size of the apertures is of great significance, in that the leak rate of microwaves through any one of said apertures is strongly dependent upon the size of that aperture. While the size of the aperture may be either larger or smaller than a wavelength of microwave energy, in the embodiment of FIG. 6, it is preferred that the aperture be the size of, or smaller than one wavelength of microwave energy. Additionally, the inventors have found that by partially unblocking the apertures, the apparatus 1 is capable of sustaining a plasma which is substantially uniform.

Referring now to FIG. 7, a third embodiment of the microwave applicator waveguide 142 has an open end portion 144 thereof and a single elongated, rectangular aperture 146, larger than a wavelength of microwave energy, formed through substantially the entire length and width dimension of a wider face thereof. The open end portion is adapted to avoid standing wave problems, though a sealed end portion may be employed for a given application. The waveguide 142 allows microwave energy to radiate from the entire aperture 146, though without more, the concentration of microwave energy is greatest at the end of the aperture nearest the source of microwave energy. The concentration of the microwave energy, and consequently the density of the plasma may be regulated by employing at least one elongated either straight or slightly curved metallic microwave shutter 150 operatively affixed to said microwave waveguide 142 by a single connection 152 consisting of, for example, a pin 153 through a channel 155, on the side of said waveguide nearest to the source of microwave energy. Disposed at the opposite end of said elongated aperture 146, and along the edges of said aperture, are dielectric insulator blocks 154 fabricated from, for example glass or teflon. The dielectric insulator blocks 154 are adapted to form an insulating barrier between the waveguide 142 and the microwave shutter 150. This is necessary since the microwave shutter 150 may be grounded to the waveguide means 142 only at the connection 152. Additional contact between the shutter 150 and the waveguide 142 will cause a so called "sizzling" ground, i.e., an arcing contact.

The waveguide embodiments shown and discussed in detail in connection with FIGS. 6 and 7 are of the type generally known as "leaky" microwave structures in that microwave energy is allowed to leak or radiate therefrom through a plurality of apertures. Alternatively, though not illustrated herein, the microwave applicators may be slow wave microwave structures. The slow wave structure delivers a significant part of microwave energy by means of evanescent waves. This type of slow wave structure was discussed hereinabove with reference to the Weissfloch, et al. and Kieser, et al. patents. The microwave energy apparatus 1 of the instant invention substantially obviates the shortcomings inherent in slow wave structures, i.e., the rapid decline in applied energy coupled to the plasma as a function of distance along the direction transverse to the microwave structure. This shortcoming is substantially obviated herein by, inter alia, isolating the microwave applicator from the plasma region, thereby allowing the applicator to sustain a more uniform plasma.

Returning now to FIG. 5, the microwave applicator unit 4 further comprises means 60 for isolating the microwave waveguide 42 from the deposition chamber 2. The isolating means 60 is preferably fabricated from a dielectric material which is substantially transparent to microwave energy. A preferred material from which said isolating means 60 may be fabricated is quartz, though it is to be understood than many other materials may be employed with equal success. The isolating means 60 should further be configured in a shape designed to optimize its ability to withstand forces due to the presence of a pressure differential. In this manner, the thickness of the isolating means may be minimized to provide for effective thermal cooling whereby high microwave power densities may be employed without deleteriously effecting the isolating means. To this end, a preferred shape for said isolating means is cylindrical or hemi-cylindrical as to encapsulate at least that portion of the waveguide 42 which extends into the vacuum vessel 2.

A cylindrical or hemi-cylindrically shape is preferred to for example a planar shape, because a cylinder may be made thinner than a planar shape due to the strength inherent in a cylinder. Thus, a thin cylinder is capable of withstanding pressures which would require a much thicker planar plate. Additionally, a thick plate cannot be maintained at a uniform, relatively low temperature, as can a thin cylinder. Thus, a planar plate may be subject to thermal degradation, in a microwave plasma apparatus particularly at elevated power levels. By contrast, the thin cylindrical isolating means 60 may be uniformly cooled, and thus does not experience thermal degradation, and therefore does not impose practical limitations upon the amount of power which may be applied.

Additionally, the waveguide 42 should be operatively disposed within the isolation means 60 and spaced from the circumferential wall thereof. So disposed, the waveguide 42 may extend partially through the vacuum vessel 2, without being directly exposed of the plasma regions 12 or 13 contained therein.

The cylindrical isolating means 60 of FIG. 5 is configured so as to be coextensive with at least one dimension of the vacuum vessel 2, and protrude through at least a first and second wall portion of said vacuum vessel 2. The cylindrical isolating means 60 is fixed through the walls of the vacuum vessel 2 by means of two collar fittings 62 and 64 which are preferably mutably joined to the stainless steel vessel 2. Collar fitting 62 comprises an open end portion 66 extending from a connection flange 68 affixed directly to a side wall of the vacuum vessel 2, and includes an opening 70 co-extensive with the circumference of the cylindrical isolating means 60 and adapted to receive cylindrical isolating means 60. Open end portion 66 extends from said connection flange 68, and is adapted to receive at least two O-rings 72, 74, which O-rings 72, 74 are adapted to effect a vacuum and water barrier between the interior of said vacuum vessel 2 and outside ambient conditions. Between O-rings 72, 74 is disposed a cooling channel 73 through which a cooling medium such as water may be circulated to maintain the O-rings at a uniformly low temperature. The O-rings 72, 74 are preferably adapted to maintain the vacuum and water seal at substantially elevated temperatures, i.e., temperatures in excess of 100° Centigrade.

The cylindrical isolating means 60 passes through opening 70, connection flange 68, and the open end portion 66. In this way, O-rings 72, 74 are urged against the outside circumference of said cylindrical isolating means 60. The compression of the O-rings 72, 74 against the cylindrical isolating means 60 results in an air tight, water tight seal. It is important to note that the location of O-rings 72, 74 is well outside the plasma region 12 of the apparatus 1. This is noteworthy because by keeping the O-rings out of the plasma region 12, they are not exposed to the excessive temperatures associated with microwave plasmas, i.e., temperatures in excess of 500° Centigrade. Had the O-ring seals been located within the plasma region, as shown in the aforementioned U.S. Pat. No. 4,729,341, special (and costly) high temperature resistant seals would have been required, greatly increasing the complexity and cost of the apparatus 1.

The cylindrical isolating means 60 may extend beyond the outside terminal edge of said open end portion 66. This portion of the cylindrical isolating means 60 must thus be equipped with microwave containment means 80. The microwave containment means 80 is typically fabricated from a metal microwave containment canister operatively affixed around the outside circumference of the cylindrical isolating means 60, and in electrical contact with said open end portion 66 by grounding fingers 82. The microwave containment canister is fabricated so as to be coextensive with that portion of cylindrical isolating means 60 which extends beyond the open end portion 66. Additionally, the microwave containment means 80 further includes an open end portion 84 over which is disposed a metallic microwave blocking mesh 86 adapted to contain stray microwaves therewithin. The mesh 86 is also adapted to allow for the passage of a flux of cooling air through the cylindrical isolating means 60. Alternatively, and as is illustrated in phantom in FIG. 5, the opened end portion 84 of the microwave containment canister 80 may be attached to a dummy load adapted to absorb excess microwave radiation. This embodiment is particularly useful at high power levels, where excess reflected microwave energy causes reflection modes which may degrade the uniformity of the microwave plasma.

The vacuum vessel 2 is further adapted to receive the cylindrical isolating means 60 through at least a second wall portion thereof, preferably the wall portion opposite the wall portion upon which collar fitting 62 is mounted. Collar fitting 64 is disposed on said opposite wall position, substantially in line with collar fitting 62. Collar fitting 64 comprises an open end portion 90 extended from a connection flange 92. Connection flange 92 is affixed directly to the opposite wall position and includes an opening 94 co-extensive with the circumference of the cylindrical isolating means 60. The open end portion 90 extends from the connection flange 92, and is adapted to receive at least two O-rings 96, 98 which are adapted to effect a vacuum and water barrier between the vacuum vessel 2 and the surrounding ambient conditions. Between O-rings 96, 98 is disposed a cooling channel 97, through which a cooling medium such as water may be circulated so as to maintain the O-rings at a uniformly low temperature. The O-rings 96, 98 like O-rings 72, 74 are adapted to withstand elevated temperatures. The cylindrical isolating means 60 is passed through opening 94, through connection flange 92 and open end portion 90 whereby O-rings 96, 98 are urged against the outside circumferential edge of said cylindrical isolating means 60. The compression of said O-rings is the mechanism by which an air tight, water tight seal is effected. Also, O-rings 96, 98, like O-rings 72, 74, are well out of the plasma region 20, and therefore not subjected to degradation thereby.

By effecting an air-tight, water tight seal around the outer circumference of the cylindrical isolating means 60, it is possible to maintain the vacuum vessel 2 at substantially sub-atmospheric pressures, while the interior of the cylindrically isolating means 60 is maintained at atmospheric pressures, and is directly exposed to ambient conditions. This is in fact an advantage in the operation of the apparatus 1. By maintaining the vacuum vessel at sub-atmospheric pressures, it is possible to operate the apparatus 1 at a pressure approximating that required for operation near the minimum of a modified Paschen curve. Additionally, the low pressures allow for a longer mean free path of travel for the plasma species, thereby contributing to overall plasma uniformity. Since the interior of the cylindrical isolating means 60 is exposed to ambient conditions, a flux of cooling air may be maintained therethrough so as to prevent the excessive heating which may be associated with microwave plasmas. Alternatively, a microwave transmissive cooling medium such as silicon oil may be circulated within the cylinder to maintain a uniform, cool temperature. The cylindrical isolating means 60, extending beyond the open end portion 90 must be sheathed within a metallic microwave containment means 100, of the type described hereinabove. The microwave containment means 100 is disposed adjacent to connection plate 102 which affects a connection between the microwave waveguide 42, and a source of microwave energy.

Another form of substrate pretreatment, which may be used with or without plasma pretreatment, is a thermal bake-out of the substrate material. This bake-out may be accomplished by providing a heat generator (i.e. coil, lamp etc.) in the apparatus such that the substrate passes nearby before any plasma pretreatment or deposition occurs. See, for example, heater 300 in FIG. 1. This bake-out of the substrate is thought to drive off water from the bulk of the substrate, thereby reducing the water vapor transmission rate of the coated product.

Finally, although enclosure of the deposition plasma region 12 within the folds of the web of substrate material 10 is highly effective in preventing the deposition of coating material onto the quartz isolation tube, a web of microwave transmissive material on payout roller 200 (FIG. 1) may be operatively positioned interiorly of said deposition chamber 1 so as to slowly move about the surface of the isolation means of the linear microwave applicator 4 and be wound about the take-up roller 201. When the microwave transmissive web is coated with an excess thickness of depositing barrier material, the rollers are indexed and a clean portion of the web is allowed to collect the unwanted buildup. In this manner, even at extremely high rates of deposition, no coating is deposited onto the outer surface of the isolation means (the quartz tube). Accordingly, the deposition process can proceed for long periods of time and is specifically adapted for volume production.

EXAMPLE 1

A microwave deposition apparatus 1 as described hereinabove with reference to FIG. 1 was employed to fabricate a clear silicon based thin film oxygen permeation barrier layer coating upon an elongated web of polyester substrate material. The exact steps by which the above described apparatus 1 was used to fabricate such coatings will be detailed hereinbelow.

An elongated roll of 0.5 mil (12 micron) thick 30 cm wide polyester was used as the substrate for the instant example. The roll of polyester substrate was loaded onto the payout roller of apparatus 1 described hereinabove with reference to FIG. 1. After placing the substrate onto the payout roller 5, the apparatus t was closed and sealed so as to effect an air tight seal between the interior of the vessel and the surrounding ambient conditions. The interior of the vessel was then evacuated to a pressure of approximately 20 to 25 millitorr. Thereafter, the interior of said chamber was purged in an argon gas environment for a period of approximately one-half hour. After purging for approximately one-half hour, the chamber was evacuated to a background pressure of approximately 3 to 4 millitorr. Thereafter, preferred feedstock gases were introduced to the interior of said chamber through said input gas manifold 9 according to the following recipe:

| GAS | FLOW RATE |
| --- | --- |
| $SiH_4$ | 180 SCCM |
| $CO_2$ | 500 SCCM |
| $O_2$ | 500 SCCM |
| Ar | 400 SCCM |

A general range of gases for this four component mixture would be about 100 to 200 SCCM $SiH_4$, 300–700 SCCM $O_2$, 300–700 SCCM $CO_2$ and 300–700 SCCM Ar.

After initiating the flow of these feedstock gases into the interior of the vacuum vessel, a microwave plasma was initiated at a frequency of 2.45 GHz and at a power of approximately 5 kilowatts. The elongated web of substrate material was passed through the deposition region 12 of the apparatus 1 at a rate of about 20 m/min. During the operation of the microwave plasma, a flux of cooling air was directed through the cylindrical isolating means 60 so as to maintain a uniform low temperature. Thereafter, microwave plasma was extinguished, and the flow of process gases to the vacuum vessel 2 was terminated.

After extinguishing the plasma and terminating the flow of process gases to the vacuum vessel 2, the interior of the reaction vessel was purged with argon, and the reaction vessel was vented to ambient conditions. Thereafter, the reaction vessel was opened and the substrate was removed for examination which revealed a uniform, clear, silicon based, thin film, oxygen permeation barrier coating on the web of substrate 10.

Tests indicate that the deposited film has the chemical composition $SiO_x$, where $x=1.8-2$. Oxygen permeation tests on a coated substrate having a 200 Å thin film deposited thereon show an $O_2$ permeation of 1 $cm^3/m^2$/day at room temperature and 0% relative humidity.

In order to obtain the impressive oxygen and water vapor impermeability behavior described herein, it was necessary to devise a method of eliminating hydrogen from the deposited film taking into account the low melting point of the PET substrate. In this regard, both the effect of increased oxygen concentration in the precursor gaseous mixture was studied and the chemical bonds responsible for water vapor diffusion were studied by conducting IR spectroscopy on sample films deposited on crystalline silicon wafers. Table A summarizes the relationship of Si—H concentration versus water vapor transmission and the precursor mixture for the Si—C—O type coating of Example 1.

A perusal of Table A will demonstrate that the Si—H concentration and the water vapor transmission decreases with the increase of oxygen concentration in the precursor gaseous mixture. It is, of course, well established that Si—H bonds readily react with water. Accordingly, it is not surprising that Si—H bonds in the deposited films will absorb, react with and create a transmission pathway for the water vapor. The conclusion to be drawn is that the relatively poor water vapor permeation properties shown in samples 1 and 2 were due to the presence of Si—H bonds in the films and that increased oxygen concentration in the precursor mixture eliminated those Si—H bonds and increased the impermeability of the films. Note that the further increase of oxygen concentration in the precursor beyond that indicated in Sample 3, failed to improve the water barrier properties. Of course, the plasma treatment process detailed hereinabove further improved the barrier properties of the deposited film.

EXAMPLE 2

A microwave deposition apparatus 1 as described hereinabove with reference to FIG. 2 was employed to fabricate a second clear silicon based thin film oxygen permeation barrier layer coating upon an elongated web of polyester substrate material. A roll of 0.5 mil (12 micron) thick 30 cm wide polyester was again used as the substrate. The roll of polyester substrate was loaded onto the payout roller of apparatus 1 described hereinabove with reference to FIG. 2. After placing the substrate onto the payout roller 5, the apparatus 1 was closed and sealed so as to effect an air tight seal between the interior of the vessel and the surrounding ambient conditions. The interior of the vessel was then evacuated to a pressure of approximately 20 to 25 millitorr. Thereafter, the interior of said chamber was purged in an argon gas environment for a period of approximately one-half hour. After purging for approximately one-half hour, the chamber was evacuated to a background pressure of approximately 3 to 4 millitorr. Thereafter, feedstock gases were introduced to the interior of said chamber through said input gas manifold 9 according to the following recipe:

| GAS | FLOW RATE |
| --- | --- |
| $SiH_4$ | 300 SCCM |
| $O_2$ | 900 SCCM |
| He | 100 SCCM |

A general range for this three component mixture would be about 200–400 SCCM $SiH_4$, 800–1000 SCCM $O_2$, and 0–200 SCCM He.

Additionally, 400 SCCM of Ar was introduced to the plasma pretreatment zone 13 through gas manifold 14. After initiating the flow of these gases into the interior of the vacuum vessel, microwave plasmas were initiated at a frequency of 2.45 GHz and at a power of approximately 6 kilowatts for Ar plasma pretreatment and 5 kilowatts for plasma deposition. The elongated web of substrate material was passed through the plasma pretreatment region 13 and deposition region 12 of the apparatus 1 at a rate of about 20 m/min. During the operation of the microwave plasma, a flux of cooling air was directed through the cylindrical isolating means 60 so as to maintain a uniform low temperature. Thereafter, microwave plasma was extinguished, and the flow of process gases to the vacuum vessel 2 was terminated.

After extinguishing the plasma and terminating the flow of process gases to the vacuum vessel 2, the interior of the reaction vessel was purged with argon, and the reaction vessel was vented to ambient conditions. Thereafter, the reaction vessel was opened and the substrate was removed for examination which revealed a uniform, clear, silicon based, thin film, oxygen permeation barrier coating on the web of substrate 10.

Tests indicate that the deposited film has the chemical composition $SiO_x$, where $x=1.8-2$. Permeation tests on a coated substrate having a 150 Å thin film deposited thereon show an $O_2$ transmission rate ($OTR$,) of less than 1 $cm^3/m^2$/day at room temperature and 0% relative humidity and a water vapor transmission rate (WVTR) of less than 1 $g/m^2$/day at 38° C. and 100% relative humidity.

While Example 2 used helium as the inert gas in the gaseous precursor mixture, argon is more preferable due to its widespread industrial use. Preferred gas flow ratios for a Si—O system, which uses a $SiH_4$, $O_2$, Ar gaseous precursor mixture, is 100 to 225 SCCM $SiH_4$, 300–675 SCCM $O_2$ and 100–450 SCCM Ar.

Table B gives the OTR and WVTR barrier properties of some specific examples of $SiO_x$ coatings produced from $SiH_4$, $O_2$, Ar gaseous precursor mixtures. As can be clearly be seen, the proper ratio of Si—H containing gas to O containing gas produces films having optimal properties.

Table C gives the specific deposition conditions and barrier properties of 18 sample films using $SiH_4$, $O_2$, Ar gaseous precursor mixtures. As can be seen, coating thicknesses of as little as about 130 Angstroms provide the composite coating/substrate with an OTR of less than 1 $cm^3/m^2$/day at room temperature and 0% relative humidity and a WVTR of less than 1 g/m²/day at 38° C. and 100% relative humidity.

EXAMPLES 3–21

In addition to pure $SiO_x$ coatings, it has been found that coatings which contain modifiers, that is, mixtures/alloys of $SiO_x$ and oxides of other elements, such as one or more of germanium, tin, phosphorus or boron, have enhanced robustness, and yet have almost as good of barrier properties as pure $SiO_x$ coatings (for comparable thicknesses). Table D discloses deposition parameters and barrier layer properties for a number of $SiO_x/GeO_x$ mixtures/alloys.

It should also be noted that silicon can be entirely replaced by germanium and still provide a relatively adequate barrier coating. This $GeO_x$ coating has very good oxygen barrier properties. While initially this barrier also has good water vapor barrier properties, the WVTR quickly deteriorates and after a while stabilizes to a moderate water vapor barrier level.

By the term "robustness" the instant inventors mean the ability of the composite (substrate/barrier) materials to be flexed, stressed, heat shrunk etc. without loosing all of its increased barrier properties. For example, four samples of 12 micron PET were coated with 50 Angstrom barrier layers. Two of the samples were coated with 50 Angstroms of $SiO_x$ and the other two were coated with 50 Angstroms of a 50/50 mixture of $SiO_x/GeO_x$ material. The oxygen transmission rate of the coated materials were recorded and then the materials were subjected to a 10% thermal shrink after which the OTR was again measured. As can be seen from Table E, the germanium modified silicon oxide coatings have better OTR characteristics than the non-modified coatings after being subjected to thermal shrinking.

While the specific examples of the instant invention are described with reference to flat rolls of a specific substrate material, specific gaseous starting materials and a specific apparatus, it should be noted that the present method is useful for deposition of high barrier coating onto many other polymer substrates of any shape, using a large variety of gaseous starting materials, by any machine which is capable of microwave plasma CVD deposition onto the desired substrate. Other types of polymer substrate materials which would benefit from a coating of high barrier material are those such as polyethylene, polypropylene, poly vinyl alcohol, polyimide, polysulphone, and those polymers coated with surface modifiers such as acrylic or polyurethane coatings. In addition to flat rolls of a single substrate material, other substrates such as multi-layered polymer laminates, plastic bottles, jars or other plastic containers in which the material to be stored is sensitive to water or oxygen would benefit from the barrier coatings and are contemplated for use in the instant invention. Specifically, the methods of the present invention can be used to deposit barrier coatings on any of the polymer substrates used in the prior art, including those multi-layered substrates having coatings of polymers to which barrier coatings readily adhere. Also of interest is coating the interior of plastic bottles or jars for storage of food or beverages. As long as the basic microwave deposition steps are present (i.e. such as thermal bake-out, plasma pretreatment, microwave PECVD of high barrier coating etc.), the shape, size and polymer material of the substrate and/or portion of the substrate to be coated is irrelevant. Finally, the instant invention can use other starting materials than shown such as those disclosed in U.S. Pat. No. 5,041,303, issued Aug. 20, 1991 to Wertheimer et al., the disclosure of which is hereby incorporated by reference.

While the invention has been described in connection with preferred embodiments and procedures, it is to be understood that it is not intended to limit the invention to the described embodiments and procedures. On the contrary it is intended to cover all alternatives, modifications and equivalence which may be included within the spirit and scope of the invention as defined by the claims appended hereinafter.

TABLE A

| Sample Number | Feedstock Gases (SCCM) | | | | Si—H Bond Content | WVTR (g/m²/day) 38° C., 100% RH |
|---|---|---|---|---|---|---|
| | $SiH_4$ | $CO_2$ | Ar | $O_2$ | | |
| 1 | 220 | 750 | 450 | 275 | 0.5% | 26 |
| 2 | 220 | 400 | 450 | 400 | Trace | 11 |
| 3 | 150 | 500 | 450 | 500 | None | 7 |

TABLE B

| Sample Number | Feedstock Gases (SCCM) | | | OTR (cc/M²/day) | WVTR (g/m²/day) |
|---|---|---|---|---|---|
| | Ar | $SiH_4$ | $O_2$ | | |
| 1 | 280 | 200 | 500 | 1.5 | 2.15 |
| 2 | 280 | 200 | 550 | 0.7 | 1.45 |
| 3 | 280 | 200 | 600 | 0.6 | 1 |

TABLE C

| Spl # | Depos. Press. mTorr | Gas Mixture (SCCM) | | | | | Depos. Plas. Pwr (kW) | | P-treat Plas. Pwr (kW) | | Approx. Film Thick. Å | $O_2$ Tran. Rate cc/m²/day | $H_2O$ Trans. Rate gr/m²/day |
|---|---|---|---|---|---|---|---|---|---|---|---|---|---|
| | | *Pre Ar* | Ar | $SiH_4$ | $O_2$ | | In | Reflec | In | Reflec | | | |
| 1 | 2.9 | 300 | 250 | 215 | 645 | | 4.5 | 0.7 | 3.5 | 0.6 | 130 | 0.68 | 0.73 |
| 2 | 2.9 | 300 | 250 | 215 | 645 | | 4.5 | 0.7 | 3.5 | 0.6 | 130 | 0.56 | 0.88 |
| 3 | 2.9 | 300 | 250 | 215 | 645 | | 4.5 | 0.7 | 3.5 | 0.6 | 130 | 0.67 | 0.56 |
| 4 | 2.9 | 300 | 250 | 215 | 645 | | 4.5 | 0.7 | 3.5 | 0.6 | 130 | 0.59 | 0.54 |
| 5 | 2.9 | 300 | 250 | 215 | 645 | | 4.5 | 0.7 | 3.5 | 0.6 | 130 | 0.64 | 0.58 |
| 6 | 3.1 | 300 | 250 | 215 | 645 | | 4.6 | 0.25 | 3.5 | 0.55 | 130 | 0.59 | 0.67 |
| 7 | 3.1 | 300 | 250 | 215 | 645 | | 4.6 | 0.25 | 3.5 | 0.55 | 130 | 0.54 | 0.67 |
| 8 | 3.1 | 300 | 250 | 215 | 645 | | 4.6 | 0.25 | 3.5 | 0.55 | 130 | 0.48 | 0.55 |
| 9 | 3.1 | 300 | 250 | 215 | 645 | | 4.6 | 0.25 | 3.5 | 0.55 | 130 | 0.54 | 0.7 |
| 10 | 3.1 | 300 | 250 | 215 | 645 | | 4.6 | 0.25 | 3.5 | 0.55 | 130 | 0.53 | 0.61 |
| 11 | 3.1 | 300 | 250 | 215 | 645 | | 4.6 | 0.2 | 3.5 | 0.55 | 130 | 0.5 | 0.76 |
| 12 | 3.1 | 300 | 250 | 215 | 645 | | 4.6 | 0.2 | 3.5 | 0.55 | 130 | 0.51 | 0.94 |
| 13 | 3.1 | 300 | 250 | 215 | 645 | | 4.6 | 0.2 | 3.5 | 0.55 | 130 | 0.76 | 0.76 |

TABLE C-continued

| Spl # | Depos. Press. mTorr | Gas Mixture (SCCM) *Pre Ar* | Ar | $SiH_4$ | $O_2$ | Depos. Plas. Pwr (kW) In | Reflec | P-treat Plas. Pwr (kW) In | Reflec | Approx. Film Thick. Å | $O_2$ Tran. Rate $cc/m^2/day$ | $H_2O$ Trans. Rate $gr/m^2/day$ |
|---|---|---|---|---|---|---|---|---|---|---|---|---|
| 14 | 3.1 | 300 | 250 | 215 | 645 | 4.6 | 0.2 | 3.5 | 0.55 | 130 | 0.51 | 0.85 |
| 15 | 3.1 | 300 | 250 | 215 | 645 | 4.6 | 0.2 | 3.5 | 0.55 | 130 | 0.49 | 0.69 |
| 16 | 2.7 | 300 | 250 | 215 | 645 | 4.8 | 0.25 | 3.5 | 0.7 | 130 | 0.34 | 0.82 |
| 17 | 2.7 | 300 | 250 | 215 | 645 | 4.8 | 0.25 | 3.5 | 0.7 | 130 | 0.35 | 0.86 |
| 18 | 2.7 | 300 | 250 | 215 | 645 | 4.8 | 0.25 | 3.5 | 0.7 | 130 | 0.41 | 0.86 |

TABLE D

| Spl # | Depos. Press. mTorr | Gas Mixture Flow Rates (SCCM) *Pre Ar* | Ar | $SiH_4$ | $O_2$ | $GeH_4$ | Depos. Plas. Pwr (kW) In | Reflec | P-treat Plas. Pwr (kW) In | Reflec | Film Thick. Å | $O_2$ Tran. Rate $cc/m^2/day$ | $H_2O$ Trans. Rate $gr/m^2/day$ As Dep. | At Sat. |
|---|---|---|---|---|---|---|---|---|---|---|---|---|---|---|
| 3a | 3.0 | 300 | 275 | 0 | 600 | 200 | 4.8 | 0.6 | 3.5 | 0.6 | 130 | 1.28 | 1.22 | 5.08 |
| 3b | 3.0 | 300 | 275 | 0 | 600 | 200 | 4.8 | 0.6 | 3.5 | 0.6 | 130 | — | 1.85 | 4.84 |
| 4a | 3.0 | 300 | 275 | 0 | 600 | 200 | 4.8 | 0.6 | 3.5 | 0.6 | 130 | — | 1.29 | 4.43 |
| 4b | 3.0 | 300 | 275 | 0 | 600 | 200 | 4.8 | 0.6 | 3.5 | 0.6 | 130 | — | 1.09 | 3.98 |
| 5a | 3.0 | 300 | 275 | 0 | 675 | 200 | 4.8 | 0.6 | 3.5 | 0.6 | 130 | 0.87 | 11.02 | 5.85 |
| 5b | 3.0 | 300 | 275 | 0 | 675 | 200 | 4.8 | 0.6 | 3.5 | 0.6 | 130 | — | — | 5.19 |
| 6a | 3.0 | 300 | 275 | 0 | 675 | 200 | 4.8 | 0.6 | 3.5 | 0.6 | 130 | — | 2.25 | 6.34 |
| 6b | 3.0 | 300 | 275 | 0 | 675 | 100 | 4.8 | 0.6 | 3.5 | 0.6 | 130 | — | 2.32 | 6.18 |
| 7a | 3.0 | 300 | 275 | 100 | 675 | 100 | 4.8 | 0.65 | 3.5 | 0.6 | 130 | 1.57 | 1.22 | 1.84 |
| 7b | 3.0 | 300 | 275 | 100 | 675 | 100 | 4.8 | 0.65 | 3.5 | 0.6 | 130 | — | 1.26 | 1.41 |
| 8a | 3.0 | 300 | 275 | 100 | 675 | 100 | 4.8 | 0.65 | 3.5 | 0.6 | 130 | — | 1.26 | 1.35 |
| 8b | 3.0 | 300 | 275 | 100 | 675 | 100 | 4.8 | 0.65 | 3.5 | 0.6 | 130 | — | 1.39 | 1.45 |
| 9a | 2.7 | 300 | 275 | 160 | 675 | 65 | 4.8 | 0.6 | 3.5 | 0.5 | 130 | 1.72 | 1.75 | 1.48 |
| 9b | 2.7 | 300 | 275 | 160 | 675 | 65 | 4.8 | 0.6 | 3.5 | 0.5 | 130 | — | 1.69 | 1.54 |
| 10a | 2.7 | 300 | 275 | 160 | 675 | 65 | 4.8 | 0.6 | 3.5 | 0.5 | 130 | — | 1.99 | 1.65 |
| 10b | 2.7 | 300 | 275 | 160 | 675 | 65 | 4.8 | 0.6 | 3.5 | 0.5 | 130 | — | 1.59 | 1.31 |
| 11a | 2.8 | 300 | 275 | 180 | 675 | 45 | 4.8 | 0.6 | 3.5 | 0.5 | 130 | — | 1.79 | 1.38 |
| 11b | 2.8 | 300 | 275 | 180 | 675 | 45 | 4.8 | 0.6 | 3.5 | 0.5 | 130 | — | 1.52 | 1.28 |
| 12a | 2.8 | 300 | 275 | 180 | 675 | 45 | 4.8 | 0.6 | 3.5 | 0.5 | 130 | — | 1.82 | 2.30 |
| 12b | 2.8 | 300 | 275 | 180 | 675 | 45 | 4.8 | 0.6 | 3.5 | 0.5 | 130 | — | 1.65 | 1.35 |
| 13a | 2.8 | 300 | 275 | 200 | 675 | 45 | 4.8 | 0.6 | 3.5 | 0.5 | 130 | — | 4.37 | 3.25 |
| 13b | 2.8 | 300 | 275 | 200 | 675 | 45 | 4.8 | 0.6 | 3.5 | 0.5 | 130 | — | 4.04 | 2.76 |
| 14a | 2.8 | 300 | 275 | 200 | 675 | 45 | 4.8 | 0.6 | 3.5 | 0.5 | 130 | — | 4.60 | 3.32 |
| 14b | 2.8 | 300 | 275 | 200 | 675 | 45 | 4.8 | 0.6 | 3.5 | 0.5 | 130 | — | 4.04 | 3.00 |
| 15a | 2.7 | 300 | 275 | 210 | 630 | 45 | 4.8 | 0.6 | 3.5 | 0.5 | 130 | — | 8.09 | 6.60 |
| 15b | 2.7 | 300 | 275 | 210 | 630 | 45 | 4.8 | 0.6 | 3.5 | 0.5 | 130 | — | 8.19 | 5.98 |
| 16a | 2.7 | 300 | 275 | 210 | 630 | 45 | 4.8 | 0.6 | 3.5 | 0.5 | 130 | — | 9.82 | 5.42 |
| 16b | 2.7 | 300 | 275 | 210 | 630 | 45 | 4.8 | 0.6 | 3.5 | 0.5 | 130 | — | 8.75 | 4.96 |
| 17a | 2.8 | 300 | 275 | 210 | 630 | 30 | 4.8 | 0.6 | 3.5 | 0.5 | 130 | 1.56 | 6.36 | — |
| 17b | 2.8 | 300 | 275 | 210 | 630 | 30 | 4.8 | 0.6 | 3.5 | 0.5 | 130 | — | 6.64 | 3.75 |
| 18a | 2.8 | 300 | 275 | 210 | 630 | 30 | 4.8 | 0.6 | 3.5 | 0.5 | 130 | — | 6.06 | 4.93 |
| 18b | 2.8 | 300 | 275 | 210 | 630 | 30 | 4.8 | 0.6 | 3.5 | 0.5 | 130 | — | 5.91 | 3.65 |
| 19a | 2.7 | 300 | 275 | 210 | 630 | 15 | 4.8 | 0.5 | 3.5 | 0.55 | 130 | 1.46 | 3.56 | 2.33 |
| 19b | 2.7 | 300 | 275 | 210 | 630 | 15 | 4.8 | 0.5 | 3.5 | 0.55 | 130 | — | 3.39 | 2.37 |
| 20a | 2.7 | 300 | 275 | 210 | 630 | 15 | 4.8 | 0.5 | 3.5 | 0.55 | 130 | — | 3.77 | 3.91 |
| 20b | 2.7 | 300 | 275 | 210 | 630 | 15 | 4.8 | 0.5 | 3.5 | 0.55 | 130 | — | 3.32 | 2.37 |
| 21a | 2.7 | 300 | 275 | 210 | 630 | 0 | 4.8 | 0.55 | 3.5 | 0.6 | 130 | 1.72 | 4.29 | 2.99 |

TABLE E

| Sample Number | Film Material | Film Thickness Å | OTR Before $cc/m^2/day$ | OTR After $cc/m^2/day$ |
|---|---|---|---|---|
| 22 | $SiO_x$ | 50 | 20.1 | 122 |
| 23 | $SiO_x$ | 50 | 14.8 | 112 |
| 24 | $SiO_x/GeO_x$ | 50 | 8.92 | 73.6 |
| 25 | $SiO_x/GeO_x$ | 50 | 14.77 | 79.8 |

We claim:

1. A composite material having an oxygen transmission rate of less than about 2.0 $cm^3/m^2/day$ at room temperature and 0% relative humidity and a water vapor transmission rate of less than about 3 $g/m^2/day$ at 38° C. and 100% relative humidity including:

a microwave-plasma-enhanced-chemical-vapor-deposited silicon oxide barrier coating; said barrier coating is 100 to 500 Angstroms thick and being substantially free of Si—H bonds; and a temperature sensitive substrate, said coating deposited atop said temperature sensitive substrate;

said composite having been produced by the method including the steps of:

providing an evacuable deposition chamber having a deposition region defined therein;

providing a source of microwave energy;

providing said temperature sensitive substrate within said deposition region in said deposition chamber;

evacuating said deposition chamber to a sub-atmospheric pressure;

performing a plasma pretreatment of said temperature sensitive substrate;

introducing a precursor gaseous mixture into said deposition region within said deposition chamber, said precursor gaseous mixture including at least a silicon-hydrogen containing gas and an oxygen containing gas;

directing microwave energy from said source of microwave energy to said deposition region, thereby creating a plasma in said deposition region by interaction of said microwave energy and said precursor gaseous mixture;

depositing from said plasma, onto said temperature sensitive substrate, said silicon oxide barrier coating, said coating providing the coated substrate with oxygen and water vapor barrier properties greater than the non-coated substrate; and introducing a sufficient flow rate of oxygen-containing gas into said precursor gaseous mixture to substantially eliminate the inclusion of silicon-hydrogen bonds into the deposited coating.

2. The composite material of claim 1, wherein said precursor gaseous mixture further includes a gas containing at least one modifier element selected from the group consisting of germanium, tin, phosphorus, and boron.

3. The composite material of claim 2, wherein said gas containing at least one modifier element selected from the group consisting of germanium, tin, phosphorus, and boron contains germanium.

4. The composite material of claim 3, wherein said gas containing germanium includes $GeH_4$.

5. The composite material of claim 3, wherein said step of introducing said precursor gaseous mixture into said deposition region within said deposition chamber includes the step of forming said precursor gaseous mixture of $SiH_4$, $GeH_4$, $O_2$ and Ar.

6. The method of claim 5, wherein said step of introducing said precursor gaseous mixture into said deposition region within said deposition chamber includes the step of introducing said precursor mixture at a rate of about 100 to 250 SCCM $SiH_4$, 300–800 SCCM $O_2$, 10–200 SCCM $GeH_4$ and 200–700 SCCM Ar.

7. The composite material of claim 2, wherein said step of introducing said precursor gaseous mixture into said deposition region within said deposition chamber includes the step of forming said precursor gaseous mixture of $SiH_4$, $GeH_4$, $O_2$ and Ar and an additional gas including at least one element selected from the group consisting of tin, boron and phosphorus.

8. The composite material of claim 2, wherein the method whereby said composite material is made includes the further step of thermally baking said temperature sensitive substrate prior to said plasma pretreatment step.

9. The composite material of claim 2, wherein said plasma pretreatment of said substrate is an argon plasma pretreatment.

10. The composite material of claim 2, wherein said temperature sensitive substrate includes an elongated, flexible polyester film.

11. The composite material of claim 2, wherein said temperature sensitive substrate includes a plastic bottle.

12. The composite material of claim 11, wherein said barrier coating is deposited onto the interior surface of said plastic bottle substrate.

13. The composite material of claim 2, wherein said temperature sensitive substrate includes a plastic jar.

14. The composite material of claim 13, wherein said barrier coating is deposited onto the interior surface of said plastic jar substrate.

15. The composite material of claim 2, wherein said composite material has an oxygen transmission rate of less than about 1.0 $cm^3/m^2$/day at room temperature and 0% relative humidity and a water vapor transmission rate of less than about 1.0 $g/m^2$/day at 38° C. and 100% relative humidity.

16. The composite material of claim 1, wherein the method whereby said composite material is made includes the further step of thermally baking said temperature sensitive substrate prior to said plasma pretreatment step.

17. The composite material of claim 1, wherein said plasma pretreatment of said substrate is an argon plasma pretreatment.

18. The composite material of claim 1, wherein said temperature sensitive substrate includes an elongated, flexible polyester film.

19. The composite material of claim 1, wherein said temperature sensitive substrate includes a plastic bottle.

20. The composite material of claim 19, wherein said barrier coating is deposited onto the interior surface of said plastic bottle substrate.

21. The composite material of claim 1, wherein said temperature sensitive substrate includes a plastic jar.

22. The composite material of claim 21, wherein said barrier coating is deposited onto the interior surface of said plastic jar substrate.

23. The composite material of claim 1, wherein said step of introducing said precursor gaseous mixture into said deposition region within said deposition chamber includes the step of forming said precursor gaseous mixture of $SiH_4$, $O_2$ and Ar.

24. The composite material of claim 23, wherein said step of introducing said precursor gaseous mixture into said deposition region within said deposition chamber includes the step of introducing said precursor mixture at a rate of about 100 to 225 SCCM $SiH_4$, 300–675 SCCM $O_2$ and 100–450 SCCM Ar.

25. The composite material of claim 24, wherein said composite material has an oxygen transmission rate of less than about 1.0 $cm^3/m^2$/day at room temperature and 0% relative humidity and a water vapor transmission rate of less than about 1.0 $g/m^2$/day at 38° C. and 100% relative humidity.

* * * * *